(12) United States Patent
Udagawa

(10) Patent No.: US 7,759,225 B2
(45) Date of Patent: Jul. 20, 2010

(54) METHOD FOR FABRICATING SEMICONDUCTOR LAYER AND LIGHT-EMITTING DIODE

(75) Inventor: Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/065,363

(22) PCT Filed: Aug. 30, 2006

(86) PCT No.: PCT/JP2006/317594

§ 371 (c)(1),
(2), (4) Date: Aug. 1, 2008

(87) PCT Pub. No.: WO2007/026937

PCT Pub. Date: Mar. 8, 2007

(65) Prior Publication Data

US 2009/0127571 A1    May 21, 2009

Related U.S. Application Data

(60) Provisional application No. 60/715,155, filed on Sep. 9, 2005.

(30) Foreign Application Priority Data

Sep. 2, 2005    (JP) .............................. 2005-254631

(51) Int. Cl.
*H01L 21/326* (2006.01)

(52) U.S. Cl. .................... 438/466; 438/487; 257/79; 257/E25.032

(58) Field of Classification Search .................... None
See application file for complete search history.

(56) References Cited

U.S. PATENT DOCUMENTS 6,530,991 B2    3/2003    Tanaka et al.

(Continued)

FOREIGN PATENT DOCUMENTS

JP    11-162849 A    6/1999

(Continued)

OTHER PUBLICATIONS (Reference 5 of IDS filed Oct. 29, 2008) D. Wang, et al. Journal of Crystal Growth "Initial growth of cubic GaN on Si (001)coated with a Thin flat SiC buffer layer,"The Furukawa Electric Co., Ltd., Yokohama R&D Laboratories, 2-4-30kano, Nishi-ki, Yokohama 220-0073,Japan, Jun. 14, 2000, pp. 204-208.*

(Continued)

*Primary Examiner*—Evan Pert
*Assistant Examiner*—Scott R Wilson
(74) *Attorney, Agent, or Firm*—Sughrue Mion, PLLC

(57) ABSTRACT

A semiconductor layer containing defects only in a small density, possessing good quality and exhibiting a large ionic bonding property as to GaN, for example, is formed on a semiconductor layer, such as a silicon carbide layer, which is made of a material possessing a small ionicity and exhibiting a strong covalent bonding property. A method for forming a semiconductor layer includes forming on the surface of a first semiconductor layer 102 possessing a first ionicity a second semiconductor layer 103 possessing a second ionicity larger than the first ionicity. The second semiconductor layer 103 is formed while irradiating the surface of the first semiconductor layer existing on the side for forming the second semiconductor layer with electrons in a vacuum.

9 Claims, 1 Drawing Sheet

U.S. PATENT DOCUMENTS

| | | | |
|---|---|---|---|
| 7,528,060 B1 * | 5/2009 | Fonseca et al. | 438/609 |
| 2005/0087746 A1 * | 4/2005 | Kryliouk et al. | 257/79 |
| 2006/0157733 A1 * | 7/2006 | Lucovsky et al. | 257/192 |

FOREIGN PATENT DOCUMENTS

| | | |
|---|---|---|
| JP | 11-265854 A | 9/1999 |
| JP | 2001-176804 A | 6/2001 |
| TW | 502287 B | 9/2002 |
| TW | 561540 B | 10/2002 |

OTHER PUBLICATIONS

Yuri M. Tairov, SiC Boule Growth, St. Petersburg Electrotechnical University, St. Petersburg, Russia, Electric Refractory Materials, edited by Yukinobu Kumashiro, Yokohama National University, Hodogaya-ku, Yokohama, Japan, Marcel Dekker, Inc. New York Basel, Copyright 2000, pp. 409-411.

Thin Film Manufacturing Handbook, Mar. 25, 1991, First Issue of First Edition, The Japan Society of Applied Physics, Thin Film and Surface Physics Division, Kyoritsu Shuppan Co., Ltd., Masao Nanjo, Kohinata 4-6-19, Bunkyo-ku, Tokyo, Japan, Sokosha Printing Ltd., pp. 73-75.

J.C. Phillips, "Bonds and Bands in Semiconductors," Bell Laboratories, Murray Hill, New Jersey, Copyright 1973, Academic Press New York and London, pp. 50, 51, and 362.

T. Sugii, et al. "Low-Tempurature Growth of B-SiC on Si by Gas-Source MBE," Fujitsu Laboratories, Limited, 10-1, Morinosato-Wakamiya, Atsugi 243-01, Japan, J. Electochem, Soc., vol. 137, No. 3, Mar. 1990, The Electrochemical Society, Inc., pp. 989-992.

D. Wang, et al. Journal of Crystal Growth "Initial growth of cubic GaN on Si (001) coated with a Thin flat SiC buffer layer,"Joint Research Center for Atom Technology, Angstrom Technology Partnership, 1-1-4 Higashi, Tskuba, Ibaraki 305-0046, Japan, The Furukawa Electric Co., Ltd., Yokohama R&D Laboratories, 2-4-3 Okano, Nishi-ki, Yokohama 220-0073, Japan, Jun. 14, 2000, pp. 204-208.

Furukawa, Seijiro, et al. "Silicon-Based Hetero Device," Maruzen Company Limited, 3-10, Nihonbashi 2-chome, Chuo-ku, Tokyo, Japan, Fuji Fine Art Printing Co. Ltd., Jul. 30, 1991, pp. 90-93.

Akazaki, Masanori, et al. "Elementary Study of Plasma Engineering, (Revised Edition)," Sangyo-tosho Publishing Co., Iidabashi 2-11-3, Chiyoda-ku, Tokyo, Japan 102-0072, 2001, pp. 22-23.

Ito, Tomonori et al., "An Empirical Potential Approach To Wurtzite-Zinc Blende Structural Stability of Semiconductors," Journal of Crystal Growth 235 (2002, pp. 149-153.

* cited by examiner

METHOD FOR FABRICATING SEMICONDUCTOR LAYER AND LIGHT-EMITTING DIODE

CROSS REFERENCE TO RELATED APPLICATIONS

This application is an application filed under 35 U.S.C. §111(a) claiming the benefit pursuant to 35 U.S.C. §119(e)(1) of the filing dates of Provisional Application No. 60/715,155 filed Sep. 9, 2005 and Japanese Patent Application No. 2005-254631 filed Sep. 2, 2005 pursuant to 35 U.S.C. §111(b).

TECHNICAL FIELD

This invention relates to a method for forming a semiconductor layer comprising forming on the surface of a first semiconductor layer having a first ionicity, a second semiconductor layer having a second ionicity larger than the first ionicity and to a light-emitting diode obtained using the method.

BACKGROUND ART

Heretofore, the technical means to form a silicon carbide layer or a gallium nitride (GaN)-based semiconductor layer on a substrate of silicon (Si), silicon carbide (SiC) or the like that excels in electrical conductivity or thermal conductivity has been known (refer to "Silicon-based Hetero Devices," written by Seijiro Furukawa and Yoshihito Amamiya and published by Maruzen K. K. on Jul. 30, 1991, pp. 91-93). For example, the technique for growing a cubic GaN layer by the Molecular Beam Epitaxial (MBE) method on a SiC film formed as an under layer on a substrate of Si has been disclosed (refer to D. Wang, et al., Journal of Crystal Growth (Holland), Vol. 220, 2000, pp. 204-208).

Besides, the method for more conveniently forming silicon carbide by carbonizing the surface of a silicon substrate with the gas of an unsaturated hydrocarbon, such as acetylene ($C_2H_2$) has been known (refer to "Silicon-based Hetero Devices" mentioned above). For example, the means to form a silicon carbide layer by placing a silicon substrate in a molecular beam epitaxial device maintained at a high degree of vacuum equivalent to $10^{-5}$ Pa or less of pressure and exposing the surface of the silicon substrate to acetylene gas, thereby carbonizing the surface has been known (refer to T. Sugii et al., Journal of Electrochemical Society, U.S.A. Vol. 137, No. 3, 1990, pp. 989-992).

The problem exists that the semiconductor layer cannot be stably formed. For example, the cubic silicon carbide (3C—SiC) has a lattice constant of 0.436 nm, which is nearly equal to the lattice constant, 0.451 nm, of the cubic GaN. Owing probably to the difference of these compounds in ionicity (refer to "Bonds and Bands in Semiconductors" (Physics Series 38) written by J. C. Phillips, published as Third Printing by Yoshioka Shoten on Jul. 25, 1985, pp. 50-51), the GaN layer formed on the silicon carbide layer copiously contains crystal defects, such as twin crystal and stacking fault. No success has been achieved in producing a GaN layer exhibiting good quality and containing crystal defects only in a small density.

This invention, developed in view of the state of affairs mentioned above, is aimed at providing a method for the formation of a semiconductor layer that is capable of forming on a semiconductor layer made of material, such as a silicon carbide layer, having a small ionicity and a strong covalent bonding property a semiconductor layer of a large ionicity, such as GaN, exhibiting good quality and containing crystal defects only in a small density and a light-emitting diode obtained by using the method for the formation of a semiconductor layer.

DISCLOSURE OF THE INVENTION

With a view to accomplishing the object mentioned above, the first aspect of the invention consists in a method for forming a semiconductor layer by forming on the surface of a first semiconductor layer having a first ionicity a second semiconductor layer having a second ionicity larger than the first ionicity, and concerns the improvement of the method comprising forming the second semiconductor layer while irradiating the surface of the first semiconductor layer existing on the side for forming the second semiconductor layer with electrons in a vacuum.

The second aspect of the invention consists in the method of the first aspect, wherein the first semiconductor layer is composed of a silicon carbide (SiC) semiconductor and the second semiconductor layer is composed of a Group III nitride semiconductor.

The third aspect of the invention consists in the method of the first aspect, wherein the first semiconductor layer is composed of a cubic silicon carbide semiconductor formed on a silicon single crystal substrate.

The fourth aspect of the invention consists in the method of the first aspect, wherein the first semiconductor layer is composed of a boron phosphide (BP)-based compound and the second semiconductor layer is composed of a Group III nitride semiconductor.

The fifth aspect of the invention consists in the method of the fourth aspect, wherein the first semiconductor layer is composed of a monomer boron phosphide formed on a silicon single crystal substrate.

The sixth aspect of the invention consists in the method of any one of the second to fifth aspects, wherein the first semiconductor layer has a surface formed of a {001} crystal face.

The seventh aspect of the invention consists in the construction of any one of the first to sixth aspects, wherein the second semiconductor layer is formed while the electrons for the irradiation have the density thereof decreased with time.

The eighth aspect of the invention consists in the construction of the seventh aspect, wherein the irradiation with electrons is stopped before the second semiconductor layer having a layer thickness of "t" reaches a layer thickness of 0.5t.

The ninth aspect of the invention consists in a light-emitting diode obtained using the method for the formation of a semiconductor layer according to any one of the first to eight aspects.

Since this invention, in forming on the surface of a first semiconductor layer possessing a first ionicity a second semiconductor layer possessing a second ionicity larger than the first ionicity, contemplates forming the second semiconductor layer while irradiating the surface of the first semiconductor layer existing on the side for forming the second semiconductor layer with electrons in a vacuum, it is capable of enhancing the "wetting" property exhibited by the semiconductor material forming the second semiconductor layer relative to the first semiconductor layer and consequently stably forming the second semiconductor layer containing twin crystals and stacking defects only in a small density, excelling in crystallinity and possessing continuity as well.

Particularly, since this invention contemplates using a silicon carbide layer as the first semiconductor layer and having a Group III nitride semiconductor layer disposed as the second semiconductor layer on the first semiconductor layer as bonded thereto, it is capable of causing the two layers sharing an ideal lattice matching property to be bonded in a state of exhibiting a high "wetting" property and consequently forming a Group III nitride semiconductor layer excelling in crystallinity.

Particularly, since this invention further contemplates using silicon single crystal as a substrate to form this substrate, thereby realizing use of a cubic silicon carbide layer excelling in quality and inducing domain matching with silicon single crystal at long cycles as a first semiconductor layer, it is capable of forming a Group III nitride semiconductor layer of excellent crystallinity as bonded with the first semiconductor layer.

Further, since this invention contemplates using a boron phosphide layer as a first semiconductor layer and forming a Group III nitride semiconductor layer bonded thereto as a second semiconductor layer, it is capable of overcoming the inferior "wetting" property revealed between the boron phosphide layer and the Group III nitride semiconductor layer and consequently realizing formation of a Group III nitride semiconductor layer containing crystal defects only in a small density and excelling in quality.

Particularly since this invention further contemplates using as a first semiconductor layer a layer of excellent quality formed on a silicon single crystal substrate and made of a monomer boron phosphide inducing domain matching with the silicon single crystal and forming a Group III nitride semiconductor layer bonded thereto as a second semiconductor layer, it is capable of causing both these layers of excellent lattice matching property to be mutually bonded in a state exhibiting a high "wetting" property and consequently realizing formation of a Group III nitride semiconductor layer excelling in crystallinity.

Since this invention contemplates using a semiconductor layer having a surface formed of a crystal face of {001} as a first semiconductor layer and forming a Group III nitride semiconductor layer by irradiating the surface of the {001} crystal face with electrons, it is capable of efficiently forming a cubic Group III nitride semiconductor layer in a stable manner.

Since this invention, in forming a second semiconductor layer on the surface of a first semiconductor layer, further contemplates forming the second semiconductor layer while causing the electrons directed toward the surface of the first semiconductor layer to be decreased in density with time from the start of the growth of the second semiconductor layer onward, it is capable of enhancing the "wetting" property revealed between the first semiconductor layer and the second semiconductor layer, keeping the second semiconductor layer from sustaining uncalled-for damage owing to the radiation of electrons over a long time as well, and consequently forming a Group III nitride semiconductor layer of excellent quality.

Particularly, since this invention, in forming a second semiconductor layer on the surface of the first semiconductor layer and after starting the growth of the second semiconductor layer aimed at a thickness of t, contemplates stopping the radiation of electrons directed toward the surface of the first semiconductor layer before the thickness of the second semiconductor layer reaches 0.5t, it is capable of keeping the second semiconductor layer from sustaining uncalled-for damage owing to the radiation of electrons over a long time and consequently forming a Group III nitride semiconductor layer of excellent quality.

Further, since this invention, in forming on the surface of a first semiconductor layer possessing a first ionicity a second semiconductor layer possessing a second ionicity larger than the first ionicity, contemplates forming the second semiconductor layer while irradiating the surface of the first semiconductor layer existing on the side for forming the second semiconductor layer with electrons in a vacuum and fulfilling the production of a light-emitting diode by using the resultant semiconductor layers, it is capable of enabling the component layers of the light-emitting diode to decrease twin crystals and stacking faults to a small density, excel in crystallinity and exhibit enhancement in luminance of emission, reverse voltage and breakdown voltage.

The above and other objects, characteristic features and advantages of the present invention will become apparent to those skilled in the art from the description to be given herein below with reference to the accompanying drawings.

BEST MODE FOR CARRYING OUT THE INVENTION

Figure 1:
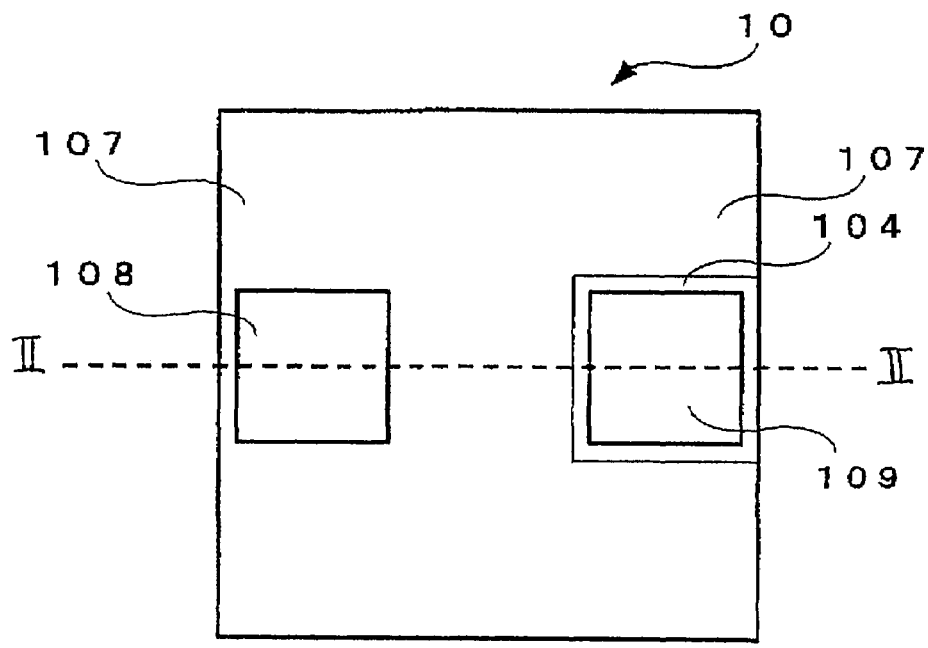
FIG. 1 is a schematic plan view illustrating a light-emitting diode described in Example 3.

This invention, in forming on the surface of a first semiconductor layer possessing a first ionicity a second semiconductor layer possessing a second ionicity larger than the first ionicity, implements the formation of the second semiconductor layer while irradiating the surface of the first semiconductor layer existing on the side for forming the second semiconductor layer with electrons in a vacuum.

The first semiconductor layer is composed of a semiconductor material possessing a smaller ionicity than the material of which the second semiconductor layer is composed as described above. Silicon (Si) and germanium (Ge), for example, are composed of covalent bonds of an element of one species and have a ionicity of 0 (zero). The ionicity of gallium nitride (GaN) is 0.500 and that of silicon carbide (SiC) is 0.177 (refer to "Bonds and Bands in Semiconductors" (Physics Series 38) written by J. C. Phillips, published as Third Printing by Yoshioka Shoten on Jul. 25, 1985, p. 51.) Then, boron phosphide (BP) exhibits a high covalent bonding property and possesses such a small ionicity as 0.006 (refer to the above "Bonds and Bands in Semiconductors," p. 51).

This invention contemplates forming the second semiconductor layer while irradiating the surface of the first semiconductor layer on the side for forming the second semiconductor layer with electrons in a vacuum with a view to enhancing the "wetting" property exhibited by the second semiconductor layer relative to the first semiconductor layer.

The term "wetting" property as used herein means the property displayed by the second semiconductor layer in covering the surface of the first semiconductor layer (refer to "Handbook of Thin Film Fabrication," compiled by Thin Film and Surface Physics Section of Society of Applied Physics and published by Kyoritsu Shuppan K.K. as First Printing of First Edition, on Mar. 25, 1991, pp. 73-74). Since the "wetting" property displayed by the second semiconductor layer relative to the first semiconductor layer can be enhanced during the formation of the second semiconductor layer by radiating electrons toward the surface of the first semiconductor layer on the side for forming the second semiconductor layer, the second semiconductor layer can be grown so as to coat the surface of the first semiconductor layer evenly and equally. Owing to this enhancement of the "wetting" property, the second semiconductor layer containing crystal defects only in a small density and excelling in quality can be formed.

The radiation of electrons is executed, for example, by causing the electrons thermally emitted from the surface of a metal heated in a vacuum to be directed as accelerated toward the surface of the first semiconductor layer. For the purpose of fulfilling efficient emission of thermal electrons, it is wise to use a metal that has a small work function and a large emission constant (refer to "Basis of Plasma Engineering (revised edition)" written by Masanori Akazaki, Katsunori Muraoka, Masao Watanabe and Kenji Hebihara and published as Third Printing of Revised Edition by Sangyo Tosho K.K. on Mar. 15, 2004, p. 23). For the purpose of enabling electrons to be emitted at a density that is required by this invention, tungsten (W) (work function=4.54 eV, emission constant=70) (refer to the above "Basis of Plasma Engineering (Revised Edition)," p. 23), for example, is suitable.

The bias voltage difference between the metal used for emitting electrons and the first semiconductor layer is preferably 100 V and more preferably not less than 150 V or more and 500 V or less. Alternatively, it is 150 eV or more and 500 eV or less in terms of acceleration energy of electrons. The radiation of electrons of a high energy exceeding 500 eV is at a disadvantage in possibly inflicting damage to the surface of the first semiconductor layer and the second semiconductor layer growing on the surface and inducing formation of a crystal defect.

The electrons to be radiated preferably have a density per unit area of $1 \times 10^{11}$ electrons·cm$^{-2}$ or more and $5 \times 10^{13}$ electrons·cm$^{-2}$ or less. The density of the electrons being radiated can be calculated, for example, on the basis of the magnitude of an electric current that is induced in a metallic electrode disposed in the path of radiation of the electrons. The radiation density (electrons/cm$^2$) can be obtained by dividing the magnitude of electric current (A) resulting from the measurement by the unit charge ($1.602 \times 10^{-19}$ C/electron).

In the forming method of this invention which radiates electrons toward the surface of the first semiconductor layer during the formation of the second semiconductor layer, what can be favorably utilized is the means of growing that is capable of readily generating and radiating electrons and implementing the growth in an environment of high vacuum. The means includes the molecular beam epitaxial (MBE) method and the chemical beam epitaxial (CBE) method, for examples.

When the second semiconductor layer is grown by the MBE method, for example, the electrons are preferably radiated at a lower angle of elevation based on the surface of the first semiconductor layer (standard of horizon) than the angle at which the raw material used for the formation of the second semiconductor layer is radiated toward the surface of the first semiconductor layer. By decreasing the angle of radiation of the electrons as described above, it is made possible to avoid deep penetration of the electrons from the surface of the first semiconductor layer inward, consequently activate preferentially the surface of the first semiconductor layer on which the second semiconductor layer is formed and the atoms constituting the crystal that forms the first semiconductor layer existing in the shallow region approximating closely thereto, and efficiently enhance the "wetting" property exhibited by the second semiconductor layer.

As regards the angle at which the electrons are radiated, the angle of elevation is preferably in the range of from 5° or more to 75° or less. More preferably, it is 10° or more and 45° or less. When the electrons are radiated at this angle, the path of electrons in passing the raw material forming the second semiconductor layer and reaching to the surface of the first semiconductor layer can be elongated. The angle, therefore, is effective in activating more efficiently the raw material used for forming the second semiconductor layer and enhancing the "wetting" property exhibited by the second semiconductor layer relative to the surface of the first semiconductor layer.

Further, the electrons are preferably enabled by such a measure as rotating the first semiconductor layer or deflecting the direction of radiation of the electrons to irradiate a nearly whole surface of the first semiconductor layer defining the second semiconductor layer.

The effect of forming the second semiconductor layer of good quality excelling in crystallinity while irradiating the surface of the first semiconductor layer with electrons can be manifested conspicuously when the first semiconductor layer is a silicon carbide (SiC) layer and when the second semiconductor layer is a Group III nitride semiconductor layer. The silicon carbide of which the first semiconductor layer is composed is, for example, cubic silicon carbide of a 3C crystal structure or hexagonal silicon carbide of a 4H or 6H crystal structure according to the Ramsdell notation (refer to "Electric Refractory Materials," Maracel Dekker, Inc., 2000, pp 409-411).

The term "Group III nitride semiconductor layer" embraces GaN, aluminum nitride (AlN), indium nitride (InN), and aluminum-gallium-indium nitride ($Al_XGa_YIn_ZN$, in which $0 \leq X, Y, Z \leq 1$, and $X+Y+Z=1$) which is a mixed crystal thereof, for example. Besides, gallium nitride phosphide ($GaN_{1-Y}P_Y$, in which $0 \leq Y < 1$) that contains nitrogen (N) and Group V elements, such as phosphorus (P) and arsenic (As), other than nitrogen constitutes a Group III nitride semiconductor.

When a procedure of forming a Group III nitride semiconductor layer as the second semiconductor layer while irradiating the surface of a silicon carbide layer as the first semiconductor layer with electrons is elected, the "wetting" property exhibited by the Group III nitride semiconductor relative to the surface of silicon carbide can be enhanced. As a result, the Group III nitride layer of good quality conspicuously suppressing twin crystals and stacking faults and excelling in crystallinity can be formed. The condition of the conspicuous decrease of the density of grain boundaries due to defects, such as twin crystal, in the inner part of the second semiconductor layer as compared with the Group III nitride semiconductor layer formed by the conventional means on a silicon carbide layer without radiation of electrons can be visually observed, for example, in a cross section TEM image picked up utilizing a transmission electron microscope (TEM).

Particularly, on the first semiconductor layer formed of cubic silicon carbide of a 3C crystal structure (3C—SiC) layer formed on a silicon single crystal substrate, the Group III nitride semiconductor layer of good quality suppressing crystal defects to a small density can be formed by this invention. The 3C—SiC layer can be formed by carbonizing any of various crystal faces of a silicon single crystal which constitutes a substrate. In a chamber maintained in high vacuum equivalent to a pressure of $1 \times 10^{-5}$ Pa or less and used for the growth of MBE, for example, the surface of a silicon single crystal substrate is carbonized by irradiating the surface with acetylene ($C_2H_2$). Though the gas such as acetylene which is used for the carbonization may be spouted in a horizontal direction nearly parallel to the surface of the silicon single crystal substrate, it is preferably spouted at an angle of elevation of 30° or more and 90° or less based on the surface of the substrate as the standard of horizon. The angle 90° of elevation indicates the direction that is perpendicular to the surface of the silicon single crystal substrate. When the hydrocarbon-based gas is spouted not in a horizontal direction but at an angle in the range mentioned above toward the surface of the substrate, the carbonization of the silicon single crystal substrate can be promoted and the 3C—SiC layer can be efficiently formed on the surface of the substrate.

The formation of the 3C—SiC layer on the surface of the silicon single crystal substrate is efficiently implemented by heating the silicon single crystal substrate. The heating is preferably carried out at least till the temperature at which the hydrocarbon-based gas in use is thermally decomposed is surpassed. Generally, the 3C—SiC layer is preferably formed while the silicon single crystal substrate is kept at a temperature of 400° C. or more. Preferably, this temperature is 500° C. or more and 1050° C. or less. If the 3C—SiC layer is formed at a high temperature exceeding 1050° C., the excess will be at a disadvantage in inducing the layer to form a "warp" owing to the difference of the layer in thermal expansion coefficient from the silicon single crystal substrate.

When the radiation of electrons is performed in concert with the radiation of the hydrocarbon-based gas during the carbonization of the surface of the silicon single crystal substrate, the 3C—SiC layer to be formed is enabled to excel in crystallinity. The angle of radiation of electrons is supposed to be smaller than the angle of radiation of a hydrocarbon-based gas, such as acetylene. Specifically, in terms of the angle of elevation based on the surface of the silicon single crystal substrate as the standard of horizon, the electrons are radiated at a smaller angle of elevation than the angle of elevation at which the hydrocarbon-based gas is radiated. Though the electrons may be radiated at an angle equal to or greater than the angle of radiation of the hydrocarbon-based gas, this angle is at a disadvantage in suffering the radiated electrons to penetrate deeply the inner part of the silicon single crystal substrate, inflict damage to the silicon single crystal substrate destined to constitute the basis material of the 3C—SiC layer, and degrade the quality of the crystal as the basis material.

The radiation of electrons may be restricted to the initial stage of the formation of the SiC layer. The radiation of electrons enables formation of the 3C—SiC layer of such good quality as suppressing crystal defects, such as stacking fault and twin crystal, to a small density. Though the radiation may be continued into the period for growing the 3C—SiC layer, the radiation of an electron beam, when continued at a high density over a long time, will possibly result in increasing the damage inflicted on the 3C—SiC layer and rendering difficult stable formation of a 3C—SiC layer excelling in crystallinity. The kind and the density of crystal defects contained in the 3C—SiC layer can be investigated, for example, from an image formed with a cross section transmission electron microscope (TEM). Further, the 3C—SiC layer having the directions of orientation arranged uniformly can be formed. The property of orientation can be investigated, for example, by analysis means, such as the X-ray diffraction (XRD) method.

This invention may use a boron phosphide (BP)-based compound semiconductor as the first semiconductor layer and a Group III nitride semiconductor layer as the second semiconductor layer. The term "boron phosphide-based semiconductor" means a Group III-V compound semiconductor having boron (B) and phosphorus (P) as component elements. Boron phosphide (BP), boron-indium phosphide ($B_{1-X}In_XP$ wherein $0 \leq X < 1$) and boron-aluminum phosphide ($B_{1-X}Al_XP$ wherein $0 \leq X < 1$) are examples.

Monomer boron phosphide, which has a cubic zinc blende crystal structure, is used advantageously as the first semiconductor layer that is intended to allow the second semiconductor layer made of a Group III nitride semiconductor to be formed thereon. Since the monomer BP has a lattice constant of 0.454 nm, it exhibits an excellent lattice matching property with the cubic GaN (lattice constant=0.451 nm) and the cubic AlN (lattice constant=0.438 nm). The spacing between the (110) crystal faces of the cubic BP monomer (=0.321 nm) nearly conforms to the GaN a-axis (=0.320 nm) and the AlN a-axis (=0.311 nm) of the hexagonal wurtzite crystal structure. When the procedure of using the monomer BP layer as the first semiconductor layer and forming on this layer the second semiconductor layer composed of cubic GaN, cubic AlN, GaN of hexagonal wurtzite crystal structure or AlN of hexagonal wurtzite crystal structure is elected, the Group III nitride semiconductor layer that is destined to constitute the second semiconductor layer exhibiting excellent crystallinity by reflecting the good lattice matching property can be formed on the first semiconductor layer showing an enhanced "wetting" property.

The boron phosphide-based semiconductor layer including the monomer BP and constituting the first semiconductor layer can be formed by vapor phase growth means, such as the halogen vapor phase epitaxial (VPE) growth method, the hydride VPE growth method, the metalorganic chemical vapor deposition (MOCVD) method and the CBE method. By the MOCVD method, for example, the boron phosphide-based semiconductor layer can be formed by using a substrate of silicon single crystal. Since the monomer BP has an ionicity of only 0.006, the boron phosphide layer can be readily formed on the silicon single crystal showing a covalent bonding property (ionicity=0).

Particularly when a single crystal having a (001) crystal face as the surface thereof is used as the substrate, the first semiconductor layer having a (001) crystal face as the surface thereof can be formed. When the silicon single crystal having a (001) crystal face as the surface thereof namely the (001)-silicon single crystal, is used as the substrate, for example, the cubic silicon carbide layer or the boron phosphide-based semiconductor layer having a (001) crystal face as the surface thereof can be favorably formed as the first semiconductor layer. By using the 3C—SiC layer or the BP-based semiconductor layer having a (001) crystal face as the surface thereof is used as the first semiconductor layer, the cubic second semiconductor layer can be efficiently formed. This is because the (001) crystal face of the first semiconductor layer of the cubic zinc blende crystal structure, owing to the atomic arrangement thereof, functions preferentially in giving birth to the cubic second semiconductor layer.

The Group III nitride semiconductor of the cubic zinc blende crystal structure, unlike the hexagonal crystal, has the transition energy thereof uniformly fixed because the valence band thereof is degenerated. The fact that the cubic Group III nitride semiconductor layer is utilized as the second semiconductor layer, therefore, proves to be advantageous for configuring a laser diode (LD) having a uniform oscillation wavelength. The cubic Group III nitride semiconductor, as compared with the hexagonal wurtzite crystal, proves to be advantageous for configuring a normally off-type electric field effect transistor (FET) because it is less affected by the piezo effect.

This invention is characterized by forming the Group III nitride semiconductor layer as the second semiconductor layer while irradiating the first semiconductor layer with electrons. When the procedure of forming the second semiconductor layer while decreasing with time the density of electrons used for radiation is elected, the second semiconductor layer containing crystal defects only in a small density can be formed particularly in the region neighboring the interface of bonding with the first semiconductor layer. In the case of forming on the first semiconductor layer made of monomer BP the cubic zinc blende-based GaN layer as the second semiconductor layer, for example, the density of electrons radiated is $2 \times 10^{13}$ cm$^{-2}$ at the time of starting the formation of the second semiconductor layer and the density of radiated electrons is subsequently decreased linearly with time till the formation of the second semiconductor layer reaches the time of completion.

In the aforementioned forming method of disposing the second semiconductor layer as bonded to the first semiconductor layer while changing with time the density of electrons radiated, when the procedure of causing the radiation of electrons proceeding from the time of starting the growth of the second semiconductor layer to an expected thickness of "t" to be stopped before the thickness of the second semiconductor layer reaches 0.5t is elected, it enables formation of the second semiconductor layer excelling in crystallinity to a greater degree. When the cubic GaN layer having an expected thickness of 100 nm (=the second semiconductor layer) is to be disposed as bonded to the 3C—SiC layer formed on the (001) silicon single crystal substrate, for example, the radiation of electrons is stopped after the growth of the cubic GaN layer is started and before the thickness of this layer reaches 50 nm. In the case of forming the second semiconductor layer having a thickness of "t", for example, the radiation of electrons toward the surface of the first semiconductor layer is stopped at the time that the thickness of the second semiconductor layer increasing since the start of the growth reaches 0.2t.

When the radiation of electrons is continued at a high density exceeding $5 \times 10^{13}$/cm$^2$ (per unit area=1 cm$^2$) without variation till the growth of the second semiconductor layer is completed, it does not render preferential the stable formation of the second semiconductor layer of good quality because it adds to the damage inflicted on the second semiconductor layer. The second semiconductor layer formed by continuing the radiation of electrons for a long time is fated to contain twin crystals ad stacking faults copiously in the inner part thereof. Abnormal diffraction spots and streaks appear in an electron diffraction image that originates in a crystal layer containing twin crystals and stacking faults.

The electron diffraction image originating in the second semiconductor layer formed as simultaneously irradiated with electrons under the suitable conditions contemplated by this invention is characterized by scarcely discernible presence of abnormal spots owing to twin crystals, for example. From this fact, it is inferred that the electrons radiated during the formation of the second semiconductor layer are capable of suppressing the occurrence of stacking faults or twin crystals in the second semiconductor layer.

EXAMPLE 1

This invention will be specifically described with reference to the case of forming a cubic GaN layer while simultaneously radiating an electron beam on a silicon carbide layer formed on a (001) crystal face constituting the surface of a (001)-silicon single crystal substrate.

A phosphorus (P)-doped n-type Si single crystal substrate was conveyed at room temperature into the growth chamber of a molecular beam epitaxial (MBE) growth device. The substrate was subsequently heated in a high vacuum of about $1 \times 10^{-7}$ Pa to 1050° C. The fact that the heat treatment of the substrate at the high temperature in the high vacuum induced a (2×1) reconstruction structure of a (001) crystal face constituting the surface of the substrate was confirmed by an ordinary reflection high-energy electron diffraction (RHEED).

Thereafter, the temperature of the silicon single crystal substrate was lowered to 490° C. while the high vacuum was retained constant. After the temperature of the substrate was stabilized, acetylene ($C_2H_2$) gas of high purity (99.999%) was sprayed at a flow rate of about 1 cc per minute toward the (001) of the surface of the substrate. The spray of the acetylene gas toward the (001) crystal face constituting the surface of the silicon single crystal substrate was continued over a period of exactly 10 minutes to induce adsorption of acetylene to the surface. Subsequently, the temperature of the silicon single crystal substrate was elevated to 590° C. to induce formation of a cubic silicon carbide (3C—SiC) layer by utilizing the adsorbed acetylene. The 3C—SiC layer thus formed had a thickness of about 2 nm. After the formation of the 3C—SiC layer was completed, the temperature of the silicon single crystal substrate was elevated to 720° C.

The formation of the cubic GaN layer was started while the radiation of electrons was simultaneously implemented toward the (001) crystal face constituting the surface of the 3C—SiC layer which was rotated at a rate of 10 cycles per minute. The electrons were emitted from a tungsten (W)-coiled filament resistance-heated inside the MBE growth chamber and radiated at an accelerating voltage of 300 V toward the surface of the silicon carbide layer. The radiation density of the electrons was set at $1.5 \times 10^{13}$ cm$^{-2}$. The electrons were radiated from the direction of about 30° as the angle of elevation based on the surface of the 3C—SiC layer as the standard of horizon.

The cubic GaN layer was grown by the MBE method using metallic gallium (Ga) as the Ga source. As the nitrogen source, the electrically neutral nitrogen radicals extracted from nitrogen plasma excited with a microwave having a frequency of 13.56 MHz were used. The molecular beam of Ga was radiated together with the nitrogen source over a period of exactly 2 hours toward the surface of the 3C—SiC layer to induce formation of an n-type cubic GaN layer having a thickness of 1.2 μm. The nitrogen plasma was radiated from the direction approximately perpendicular to the surface of the 3C—SiC layer. The Ga beam was radiated from the direction of about 80° as the angle of elevation from the surface of the 3C—SiC layer. The radiation of electrons with the density mentioned above, subsequent to the start of the growth of the cubic GaN layer, was stopped at the time that the thickness of the cubic GaN layer reached about 100 nm.

The cross section TEM image was visually observed by using an ordinary transmission electron microscope (TEM). As a result, the presence of a {111} stacking fault and a {111} twin crystal was hardly discerned in the cubic GaN layer.

COMPARATIVE EXAMPLE 1

On the surface of the 3C—SiC layer formed by following the procedure of Example 1, a GaN layer was formed without resorting to the same radiation of electrons as used in Example 1. The GaN layer was formed in the same manner as in Example 1 excepting the omission of the radiation of electrons.

After the growth of the GaN layer was completed, the GaN layer was cooled in a vacuum to room temperature. Then, it was removed from the MBE chamber and subjected to visual observation by the cross-sectional TEM technique to observe the crystal structure in the inner part of the GaN layer. The section TEM image enabled confirmation of the presence of grain boundaries in a copious amount in the inner part of the GaN layer neighboring the region adjoining the 3C—SiC layer. Further, the electron diffraction image of the GaN layer enabled conformation of slight inclusion of the hexagonal GaN crystal in the cubic GaN layer.

EXAMPLE 2

This invention will be specifically described with reference to the case of forming a hexagonal AlGaN layer while simultaneously radiating an electron bean on a silicon carbide layer formed on a (111) crystal face constituting the surface of a (111)-silicon single crystal substrate.

A boron (B)-doped p-type Si single crystal substrate was conveyed at room temperature into the growth chamber of a molecular beam epitaxial (MBE) growth apparatus. Then, the substrate was heated in a high vacuum of about $1 \times 10^{-7}$ Pa to 850° C. The fact that the heat treatment of the substrate at the high temperature in the high vacuum induced a (7×7) reconstruction structure of a (111) crystal face constituting the surface of the substrate was confirmed by an ordinary reflection high-energy electron diffraction (RHEED).

Thereafter, the temperature of the silicon single crystal substrate was lowered to 490° C. while the high vacuum was retained constant. After the temperature of the substrate was stabilized, acetylene ($C_2H_2$) gas of high purity (99.999%) was sprayed at a flow rate of about 1 cc per minute toward the (111) of the surface of the substrate. The spray of the acetylene gas toward the (111) crystal face constituting the surface of the silicon single crystal substrate was continued over a period of exactly 8 minutes to induce adsorption of acetylene to the surface. Subsequently, the temperature of the silicon single crystal substrate was elevated to 570° C. to induce formation of a cubic silicon carbide (3C—SiC) layer by utilizing the adsorbed acetylene. The 3C—SiC layer thus formed had a thickness of about 2 nm. After the formation of the 3C—SiC layer was completed, the temperature of the silicon single crystal substrate was elevated to 750° C.

The formation of a hexagonal $Al_{0.1}Ga_{0.9}N$ mixed crystal layer was started while the radiation of electrons was simultaneously implemented toward the (111) crystal face constituting the surface of the 3C—SiC layer which was rotated at a rate of 10 cycles per minute. The electrons were emitted from a tungsten (W)-coiled filament resistance-heated inside the MBE growth chamber and radiated at an accelerating voltage of 300 V toward the surface of the silicon carbide layer. The radiation density of the electrons was set at $2.0 \times 10^{13}$ cm$^{-2}$. The electrons were radiated from the direction of about 20° as the angle of elevation based on the surface of the 3C—SiC layer as the standard of horizon.

The hexagonal $Al_{0.1}Ga_{0.9}N$ mixed crystal layer was grown by the MBE method using metallic gallium as the Ga source and metallic aluminum as the Al source. As the nitrogen source, the electrically neutral nitrogen radicals extracted from nitrogen plasma excited with a microwave with a frequency of 13.56 MHz were used. The molecular beams of Ga and Al were radiated together with the nitrogen source over a period of exactly 2 hours toward the surface of the 3C—SiC layer to induce formation of an n-type hexagonal $Al_{0.1}Ga_{0.9}N$ mixed crystal layer having a thickness of 1.3 μm. The nitrogen plasma was radiated from the direction approximately perpendicular to the surface of the 3C—SiC layer. The Ga beam and the Al beam were radiated from the direction of about 80° as the angle of elevation from the surface of the 3C—SiC layer.

The radiation of electrons with the density mentioned above, subsequent to starting the growth of the hexagonal $Al_{0.1}Ga_{0.9}N$ mixed crystal layer, was decreased stepwise with growth time. The density of electrons radiated was set at $2.0 \times 10^{13}$ cm$^{-2}$ during the elapse of 5 minutes following the start of the growth of the hexagonal $Al_{0.1}Ga_{0.9}N$ mixed crystal layer and at $5.0 \times 10^{12}$ cm$^{-2}$ during the elapse of 5 minutes following the elapse of the former 5 minutes. Thereafter, the radiation of electrons was stopped after the elapse of 10 minutes following the start of the growth of the $Al_{0.1}Ga_{0.9}N$ mixed crystal layer. Incidentally, at the time that the radiation of electrons was stopped, the thickness of the $Al_{0.1}Ga_{0.9}N$ mixed crystal layer reached about ⅙ of the total layer thickness of 1.3 μm.

A cross-sectional TEM image was observed by using an ordinary transmission electron microscope (TEM). The observation detected virtually absence of stacking failure in the hexagonal $Al_{0.1}Ga_{0.9}N$ mixed crystal layer, indicating that the formed $Al_{0.1}Ga_{0.9}N$ mixed crystal layer possessed good quality.

EXAMPLE 3

The effect of the present invention will be specifically described with reference to the case of manufacturing a Group III nitride semiconductor light-emitting diode utilizing a GaN layer formed while continuing radiation of electrons as in Example 1.

Figure 2:
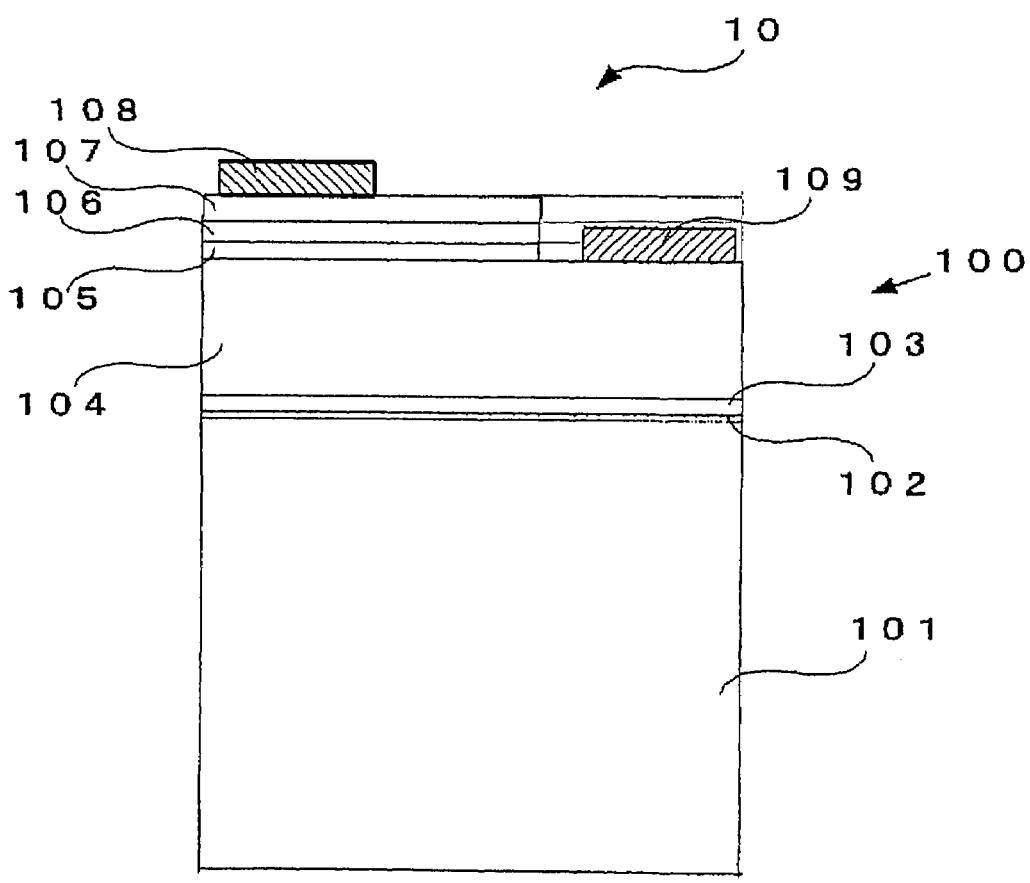
FIG. 2 is a schematic cross section illustrating the light-emitting diode taken through FIG. 1 across line II-II.

FIG. 1 illustrates a schematic planar structure of the light-emitting diode (LED) described in Example 3 and FIG. 2 a schematic sectional structure thereof taken through FIG. 1 along broken line II-II.

A stacked structure 100 for use in an LED 10 was composed by stacking a cubic (001) silicon carbide layer 102 disposed on the surface of a phosphorus (P)-doped n-type silicon single crystal substrate 101, a cubic GaN layer 103 disposed thereon, a lower clad layer 104 formed of an n-type cubic GaN doped with silicon (Si) by the MBE method, a multiple quantum well structure light-emitting layer 105 formed of a structure resulting from alternately stacking an n-type gallium-indium nitride ($Ga_{0.9}In_{0.1}N$) mixed crystal layer and an n-type GaN barrier layer in five cycles, an upper clad layer 106 formed of a cubic p-type $Al_{0.1}Ga_{0.9}N$ and a contact layer 107 formed of a p-type GaN sequentially in the order mentioned as described in Example 1 cited above.

Since the lower clad layer 104 and the contact layer 107 were formed through the cubic GaN layer 103 containing crystal defects only in a small density, they were both found by an ordinary cross-sectional TEM observation to contain scarcely crystal defects, such as twin crystals, and excel in crystallinity.

Thereafter, a p-type ohmic electrode 108 was disposed on the surface of the contact layer 107. An n-type ohmic electrode 109 was meantime disposed in contact with the surface of the lower clad layer 104 to complete the composition of the LED 10.

This LED 10 was tested for the light-emitting property by passing a device operation current of 10 mA in the forward direction between the p-type and n-type ohmic electrodes 108 and 109. The main light emitted from this LED 10 had a wavelength of about 450 nm. The luminance of emission of this LED still in the form of a chip was about 1.5 cd. The reverse voltage (where the reverse current was set at 10 μA) had a high magnitude exceeding 15 V that reflected good crystallinity of the Group III nitride semiconductor layers constituting the lower clad layer 104, light-emitting layer 105 and upper clad layer 106 of which the light-emitting part of the p-n junction-type DH structure was composed. Further, owing to the good crystallinity of the Group III nitride semiconductor layers, the local breakdown was scarcely discerned.

COMPARATIVE EXAMPLE 2

A Group III nitride semiconductor light-emitting diode manufactured by utilizing the GaN layer formed by the conventional method omitting the radiation of electrons as described in Comparative Example 1 was tested for the light-emitting property by passing a device operation current of 20 mA in the forward direction between the p-type and n-type ohmic electrodes of the diode. While the main light emitted had a wavelength of about 450 nm that is approximately equal to that of Example 3, the luminance of emission of the diode still in the form of a chip was about 1.2 cd and the reverse voltage (where the reverse current was set at 10 µA) was 13V, both low magnitudes, and the local breakdown was observed. These inferior properties were thought to originate in the GaN layers containing twin crystals and other crystal defects in copious amounts and exhibiting deficiency in crystallinity.

INDUSTRIAL APPLICABILITY

A semiconductor layer of a large ionicity exhibiting good quality and containing crystal defects only in a small density can be formed on a semiconductor layer made of material having a small ionicity and a strong covalent bonding property utilizing a method of irradiating the surface of the latter semiconductor layer existing on the side for forming the former semiconductor layer with electrons in a vacuum. A light-emitting diode can be obtained using the method for the formation of the semiconductor layer.

The invention claimed is:

1. A method for forming a semiconductor layer comprising forming on a surface of a first semiconductor layer having a first ionicity a second semiconductor layer having a second ionicity larger than the first ionicity, wherein the second semiconductor layer is formed while irradiating the surface of the first semiconductor layer existing on a side for forming the second semiconductor layer with electrons in a vacuum.

2. A method according to claim 1, wherein the first semiconductor layer is composed of a silicon carbide semiconductor and the second semiconductor layer is composed of a Group III nitride semiconductor.

3. A method according to claim 2, wherein the first semiconductor layer is composed of a cubic silicon carbide semiconductor formed on a silicon single crystal substrate.

4. A method according to claim 2, wherein the first semiconductor layer has a surface formed of a crystal face of {001}.

5. A method according to claim 1, wherein the first semiconductor layer is composed of a boron phosphide-based compound and the second semiconductor layer is composed of a Group III nitride semiconductor.

6. A method according to claim 5, wherein the first semiconductor layer is composed of a monomer boron phosphide formed on a silicon single crystal substrate.

7. A method according to claim 1, wherein the second semiconductor layer is formed while the electrons for the irradiation have the density thereof decreased with time.

8. A method according to claim 7, wherein the irradiation with electrons is stopped before the second semiconductor layer having a layer thickness of t reaches a layer thickness of 0.5t.

9. A light-emitting diode obtained using the method for forming a semiconductor layer according to claim 1.

* * * * *